US006023199A

United States Patent [19]

Cheung

[11] Patent Number: 6,023,199

[45] Date of Patent: Feb. 8, 2000

[54] PULSE WIDTH MODULATION CIRCUIT AND METHOD

[75] Inventor: Kam Tim Cheung, New Territories, The Hong Kong Special Administrative Region of the People's Republic of China

[73] Assignee: Motorola, Inc., Schaumburg, Ill.

[21] Appl. No.: 09/008,039

[22] Filed: Jan. 16, 1998

[51] Int. Cl.[7] .................................................. H03K 7/08

[52] U.S. Cl. .......................... 332/109; 327/172; 327/175; 327/176; 375/238

[58] Field of Search .................................... 332/109, 107; 327/172, 175, 176; 375/238

[56] References Cited

U.S. PATENT DOCUMENTS 5,498,947 3/1996 Wang et al. ............................ 318/811

*Primary Examiner*—Arnold Kinkead
*Attorney, Agent, or Firm*—Rennie W. Dover

[57] ABSTRACT

A circuit and method for producing a train of pulse width modulated pulses (FIG. 2), the circuit comprising: pulse producing means (11–16) for receiving sample values at an update rate and for producing therefrom pulses whose widths are representative of the sample values, and repeater means (15) for causing the pulse producing means to produce a predetermined plurality of pulses, at an output rate which is an integral multiple of the update rate, for each said sample value, whereby the pulse train output frequency is greater than the sample value update frequency.

6 Claims, 2 Drawing Sheets

PULSE WIDTH MODULATION CIRCUIT AND METHOD

FIELD OF THE INVENTION

This invention relates to a circuit for producing a train of pulse width modulated pulses.

BACKGROUND OF THE INVENTION

Pulse Width Modulation (PWM) is widely used in DC-DC power conversion and Digital-to-Analog (D-A) conversion. A pulse width modulated output signal from a PWM circuit, typically utilizing a central processor (CPU), comprises a train of pulses at a fixed frequency and having widths proportional to values of data samples. Thus, the PWM output signal may be considered as composed of a baseband signal and a carrier frequency. In order to filter out the carrier frequency from the baseband signal as in a D-A application, a low-pass filter is typically connected at the output of the PWM circuit (which may be viewed as integrating the PWM output signal into an analog signal). But, adding a low-pass filter will increase cost, which is not desirable in cost sensitive products such as consumer electronics.

An alternative, for example in an application for generating an audible sound from sample data values, to using a discrete low pass filter for separating the carrier frequency from the baseband signal is using a frequency shifting technique. In this alternative method, sample data values of the carrier frequency are generated at an increased frequency (also called reconstruction frequency) which is an integer multiple of the original frequency. For example, the reconstruction frequency may be four times the original frequency, so that for each sample value four pulses are generated with the same width proportional to the sample data value. The reconstruction frequency is chosen so as to be beyond the frequency response of an ordinary loudspeaker and the human audible frequency range, so that the audible sound heard from a loudspeaker to which the reconstructed PWM output signal is directly applied is the desired audio.

However, this frequency shifting technique increases the required processing tasks for generating the increased number of pulses and increases CPU update rate (thus shortening the Service Latency Time).

It is an object of this invention to provide a pulse width modulation circuit in which this disadvantage may be overcome or at least alleviated.

BRIEF SUMMARY OF THE INVENTION

In accordance with a first aspect of the present invention there is provided a circuit for generating a train of pulse width modulated pulses.

In accordance with a second aspect of the present invention there is provided a method of generating a train of pulse width modulated pulses.

BRIEF DESCRIPTION OF THE DRAWINGS

One embodiment of the invention will now be more fully described, by way of example only, with reference to the accompanying drawings, in which.

DETAILED DESCRIPTION OF THE DRAWINGS

Figure 1:
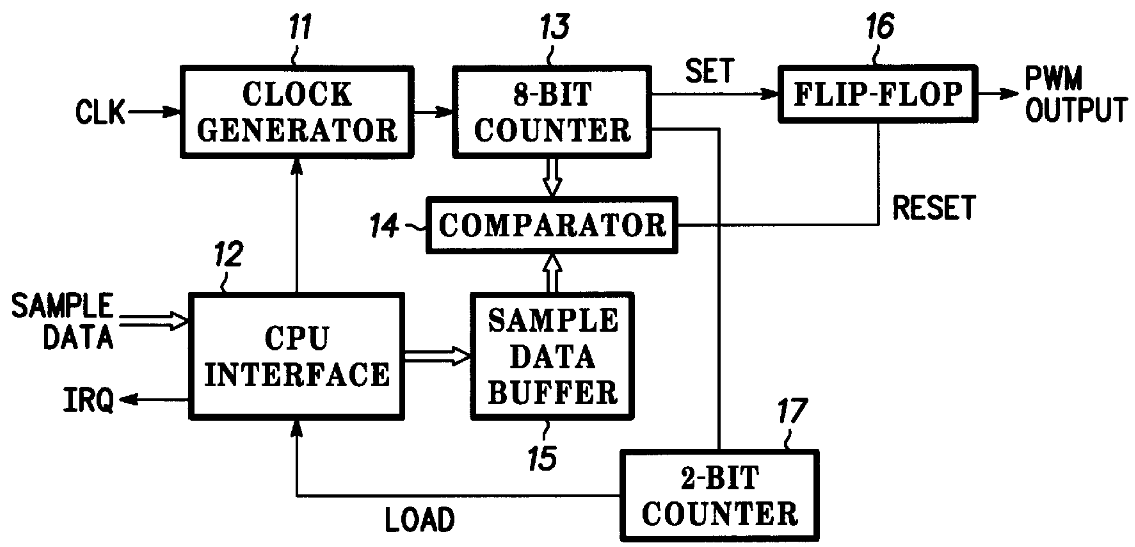
FIG. 1 shows a block diagram of a first novel circuit for producing a train of pulse width modulated pulses.

Referring to FIG. 1, a novel PWM generating circuit 10 utilizing the present invention includes a clock generator 11, a CPU Interface 12, an 8-Bit counter 13, a comparator 14, a sample data buffer 15, a flip flop 16, and a 2-Bit counter 17. The PWM generating circuit 10 may be used in a consumer electronics device such as a personal digital assistant (PDA) to generate from a series of sample data values an audio signal for application directly to a loudspeaker.

The clock generator 11 is connected to receive as inputs a system clock signal CLK and a control input signal from the CPU Interface 12. The clock generator 11 generates at its output a synchronized clock which is applied to the input of the 8-Bit counter 13. The output of the 8-Bit counter 13 is connected to one input of the comparator 14, and is also connected to the SET input of the flip flop 16. A second input of the comparator 14 comes from the sample data buffer 15 which receives its data from the CPU interface 12. The CPU interface 12 also receives an input from the 2-bit counter 17. The CPU interface 12 connects to the CPU via an IRQ interrupt pin. The comparator 14 has its output connected to the RESET input of the flip flop 16, whose output forms the output of the PWM generating circuit 10.

In use, the PWM generating circuit of FIG. 1 receives 8-bit sample data (sampled from an audio signal at a rate of 8 KHz) from a CPU (not shown) through the CPU interface 12 data input. To process the 8-bit 8 KHz sample data, the sample data is stored in the sample data buffer 15. The IRQ signal to the CPU controls sample data transfer from the CPU to the PWM when the PWM is undergoing a pulse width modulation routine. The clock generator 11 generates a synchronized clock output with the system clock input and the CPU interface control pin. The 8-bit counter 13 is a free-running counter whose size is chosen to match the size of the data samples, i.e., 8-bit. The 8-bit counter 13 starts to count from zero (incrementing every 122 nS, i.e., at a rate of 8.192 MHz which is 256 * 32 KHz) and sends a signal to the SET input of the flip flop 16. At the output of the flip flop 16, the leading edge of a corresponding PWM pulse is set to a high logic state which represents the beginning of the PWM pulse. However, if the sample value is zero, then the output of the flip-flop 16 does not go high.

The comparator 14 compares the sample data value in the buffer 15 with the value of the 8-bit counter 13. When the counter value equals the sample data value, the comparator 14 generates a signal to the RESET input of the flip flop 16. The flip flop 16 then resets the previously set output pulse to a low logic state. The counter 13 continues to count until its value reaches 255 and then rolls over to zero, at which time the counter 13 produces an output signal which is used to increment the 2-bit counter 17.

The 2-bit counter 17 controls the updating of the sample data value in the buffer 15, wherein buffer 15 counter 17 form the repeater means. When the value of the 2-bit counter 17 rolls over from three to zero, the counter produces an output signal which triggers updating of the sample data value in the data buffer 15. Thus, the same sample data value is used by the comparator 14 for four consecutive output pulses, and only after every four output pulses is the sample data value in the buffer 15 updated with the next sample data value.

Figure 2:
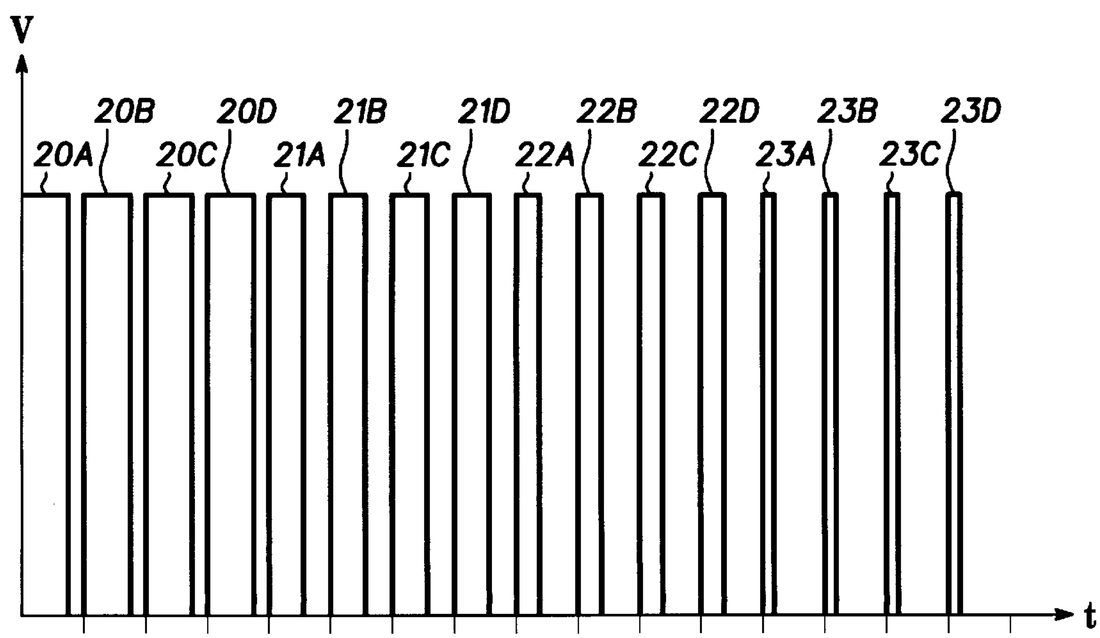
FIG. 2 shows a waveform diagram of the pulse train output from the circuit of FIG. 1.

Thus, the output pulse train (illustrated in FIG. 2) is formed at a reconstruction frequency equal to four times the original sampling frequency of the data samples (allowing the output pulse train to be applied directly to a suitable loudspeaker without the need for an additional low-pass filter to integrate the train of PWM pulses into an audio signal), each sample data value being used to produce four pulses having the same width which is proportional to the common sampled data value. FIG. 2 shows a first group of four pulses (20A, 20B, 20C & 20D) corresponding to a first sample data value, a second group of four pulses (21A, 21B, 21C & 21D) corresponding to a second sample data value, a third group of four pulses (22A, 22B, 22C & 22D) corresponding to a third sample data value, and a fourth group of four pulses (23A, 23B, 23C & 23D) corresponding to a fourth sample data value.

It will be understood that in the PWM generating circuit of FIG. 1, although the reconstruction frequency is four times that of the original sampling frequency of the sample data values, the CPU is only required to update the sample data value applied to the circuit at the original sampling frequency. Thus, it will be understood that although the reconstruction frequency is increased by a factor of four, the update rate which the circuit requires of the CPU (and hence the Service Latency Time) is unchanged.

It will be understood that if it is desired to use a reconstruction frequency whose ratio to the original sampling frequency is less than four, a further comparator (not shown) must be used with the counter 17 to cause the trigger signal for updating the sample data value to be produced when the value of the counter 17 reaches this lesser value rather than when the counter 17 exceeds its maximum value.

It will be understood that although the counter 17 has been described as a 2-bit counter, in the event that it is desired to use a reconstruction frequency whose ratio to the original sampling frequency is greater than four, a counter with a greater number of bits will be required. For example, if a reconstruction frequency eight times the original sampling frequency is required, a 3-bit counter will be required.

Figure 3:
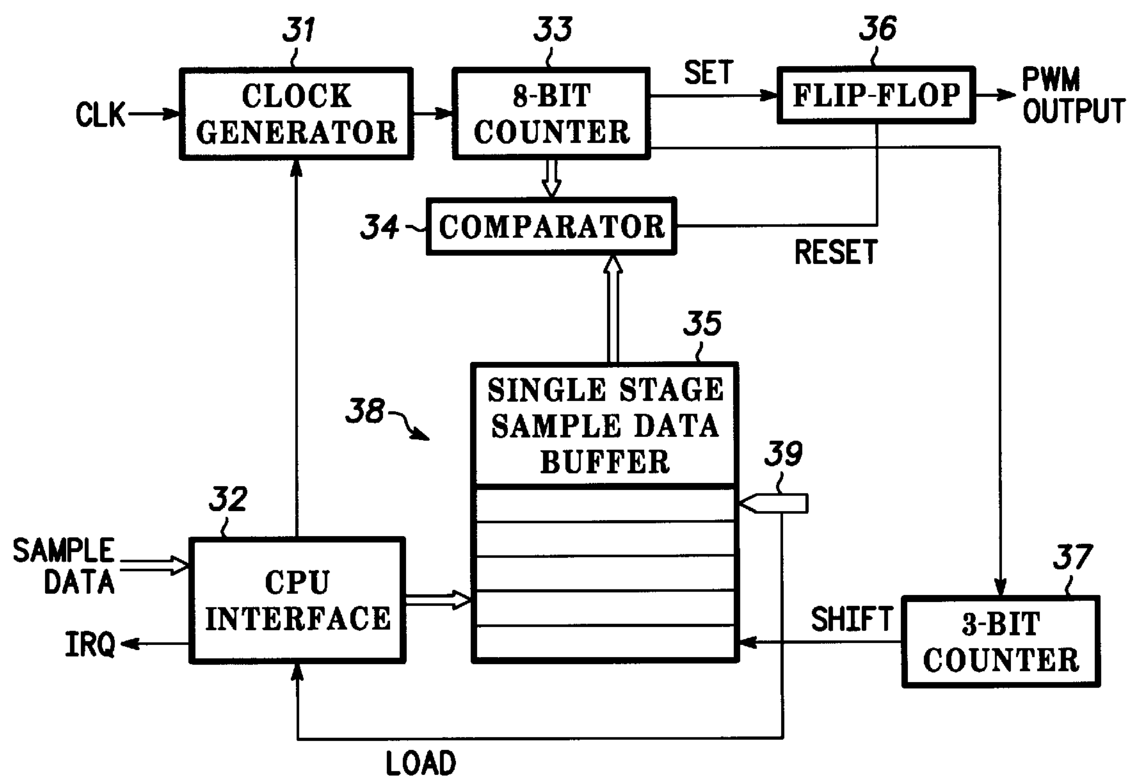
FIG. 3 shows part of the circuit of a block diagram of a second novel circuit for producing a train of pulse width modulated pulses.

FIG. 3 illustrates another novel circuit 30 for producing a train of pulse width modulated pulses in a PDA to generate from a series of sample data values an audio signal for application directly to the PDA's loudspeaker. Similarly to the PWM generating circuit 10 of FIG. 1 described above, the PWM generating circuit 30 includes a clock generator 31, a CPU Interface 32, an 8-Bit counter 33, and a comparator 34, a single stage sample data buffer 35, a flip flop 36 and a 3-bit counter 37.

In the PWM generating circuit 30, the 3-bit counter 37 replaces the 2-bit counter 17 of the FIG. 1. The PWM generating circuit 30 also includes, in addition to the single stage sample data buffer 35, a 5-stage/address First-In-First-Out (FIFO) sample data buffer 38 which includes a "water marker" pointer 39. The single stage sample data buffer 35 and the 5-stage/address First-In-First-Out (FIFO) sample data buffer 38 may be provided, as shown, as a single 6-stage register stack.

In the PWM generating circuit 30, up to five consecutive sample data values can be transferred from the CPU interface in response to a single IRQ interrupt request, thus avoiding more frequent interrupts of the CPU. The five consecutive data samples from the CPU interface 32 are stored in the 5-stage FIFO sample data buffer 38. The 3-Bit counter 37 is used (analogously to the counter 17 of FIG. 1) to control the transfer from the 5-stage FIFO buffer 38 to the single stage buffer 35.

The "water marker" pointer 39 is an address counter which tracks the number of sample data values remaining in the FIFO buffer 38. With each transfer of a data sample value from the 5-stage FIFO buffer 38 to the single stage buffer 35, the "water marker" pointer 39 is decremented, and when only one sample data value remains in the FIFO sample data buffer 5 the "water marker" pointer 39 sends an IRQ signal to trigger the downloading of more sample data values. Upon receiving the trigger signal from the "water marker", the CPU interface 32 begins to download the next five available sample data values from the CPU.

It will be understood that the 3-bit counter 37 allows a reconstruction frequency of eight times the original sampling frequency to be used, but that if it is desired to use a reconstruction frequency whose ratio to the original sampling frequency is less than eight, a further comparator (not shown) must be used with the counter 37 to cause the trigger signal for updating the sample data values to be produced when the value of the counter 37 reaches this lesser value rather when the counter 37 exceeds its maximum value.

It will be appreciated that the PWM generating circuit 30 of FIG. 3, like the PWM generating circuit 10 of FIG. 1, without increasing the update rate which the circuit requires of the CPU (and hence the Service Latency Time), allows the output pulse train to be formed at a reconstruction frequency which is an integer multiple of the original sampling frequency of the data samples (allowing the output pulse train to be applied directly to a suitable loudspeaker without the need for an additional low-pass filter to integrate the train of PWM pulses into an audio signal), each sample data value being used to produce a chosen number (up to eight) of pulses having the same width which is proportional to the common sampled data value.

It will be also be appreciated that, further to the advantageous performance of the PWM generating circuit 10 of FIG. 1 in increasing the reconstruction without increasing the update rate which the circuit requires of the CPU (and hence the Service Latency Time), the PWM generating circuit 30 of FIG. 3, reduces the update rate which the circuit requires of the CPU (at the expense only of requiring a potentially longer time to service the requested update).

I claim:

1. A circuit for producing a train of pulse width modulated pulses, the circuit comprising:

pulse producing means for receiving sample values at an update rate and for producing therefrom pulses whose widths are representative of the sample values, and repeater means for causing the pulse producing means to produce a predetermined plurality of pulses, at an output rate which is an integral multiple of the update rate, for each said sample value, whereby the pulse train output frequency is greater than the sample value update frequency.

2. A circuit as claimed in claim 1 wherein the repeater means comprises:

register means for holding a sample data value which controls the width of pulses produced by the pulse producing means;

counter means for counting the number of pulses produced by the pulse producing means for a sample value held in the register means; and update means, responsive to the counter means reaching a predetermined value, for causing a new sample value to be introduced in the register means.

3. A circuit as claimed in claim 1 wherein the repeater means comprises:

a first register for holding a sample value which controls the width of pulses produced by the pulse producing means;

a register stack for holding a plurality of sample values;

counter means for counting the number of pulses produced by the pulse producing means for a sample value held in the register means;

update means for causing a new sample value to be moved from the register stack to the first register responsive to the counter means reaching a predetermined value; and refresh means for loading a plurality of new sample values into the register stack at predetermined intervals.

4. A circuit as claimed in claim 3 wherein the register stack is a First-In-First-Out (FIFO) register stack.

5. A circuit as claimed in claim 1 wherein the pulse producing means comprises:

flip-flop means for producing the train of pulse width modulated pulses;

clock means for producing a clock signal;

a counter arranged to set the flip-flop means and to count at the frequency of the clock signal;

a comparator arranged to detect when the counter value matches the sample value and to reset the flip-flop means in response thereto.

6. A method of producing a train of pulse width modulated pulses, the method comprising:

receiving sample values at a first rate, and producing from each said sample value, at a second rate which is an integral multiple of the first rate, a predetermined plurality of pulses whose widths are representative of the sample value and whereby the train of PWM pulses have an output frequency greater than the sample value update frequency.

* * * * *